(12) United States Patent
Ong

(10) Patent No.: US 7,157,940 B1
(45) Date of Patent: Jan. 2, 2007

(54) SYSTEM AND METHODS FOR A HIGH-SPEED DYNAMIC DATA BUS

(75) Inventor: Adrian E. Ong, Pleasanton, CA (US)

(73) Assignee: Inapac Technology, Inc, San Jose, CA (US)

( * ) Notice: Subject to any disclaimer, the term of this patent is extended or adjusted under 35 U.S.C. 154(b) by 882 days.

(21) Appl. No.: 09/888,970

(22) Filed: Jun. 25, 2001

(51) Int. Cl.
 *G11C 7/12* (2006.01)
(52) U.S. Cl. .................... 326/93; 326/95; 365/203
(58) Field of Classification Search ............. 326/93, 326/95, 98, 121, 83; 365/185.13, 203
See application file for complete search history.

(56) References Cited

U.S. PATENT DOCUMENTS 5,544,109 A * 8/1996 Uchida et al. ............. 365/203
6,320,795 B1 * 11/2001 Balamurugan et al. 365/189.08
6,388,940 B1 * 5/2002 Alvandpour et al. ... 365/230.05
6,456,116 B1 * 9/2002 Coppin ..................... 326/95

* cited by examiner

Primary Examiner—Daniel D. Chang
(74) Attorney, Agent, or Firm—Sidley Austin LLP

(57) ABSTRACT

A method for driving a data signal across a data bus consists of charging the data bus to a first voltage level prior to driving the signal, maintaining the data bus at the first voltage level when a first type of data signal is to be driven, and pulling the data bus to a second voltage level when a second type of data signal is to be driven. A system for driving a data signal consists of a data bus, a charging circuit coupled to the data bus configured to charge the data bus to a first voltage level, a keeper circuit coupled to the data bus configured to maintain the data bus at the first voltage level after the charging circuit has charged the data bus, and a pull-down circuit coupled to the data bus configured to pull the data bus to a second voltage level.

6 Claims, 6 Drawing Sheets

SYSTEM AND METHODS FOR A HIGH-SPEED DYNAMIC DATA BUS

BACKGROUND

1. Field of the Invention

The invention relates generally to the field of semiconductor integrated circuits, and more particularly, to systems and methods for a high-speed dynamic data bus.

2. Background Information

A data bus is a collection of wires that are primarily used to transmit data from one location to another. They are found in electronic devices such as computers, integrated circuit devices (e.g. integrated circuits), personal digital assistants, cellular telephones, and other similar devices. A data bus makes up half of what is generally referred to as the internal bus for an electronic device. The other half of an internal bus is an address bus, which is used to transfer information about where the data should go.

Typically, data is represented on a data bus in the form of binary digits, also known as bits. Each bit in turn represents only one of two values, a "0" (also referred to as an "off"), or a "1" (also referred to as an "on"). These two values are physically represented on the data bus in the form of electrical signals. A low voltage signal, ideally at zero volts, corresponds to the "0", while a high voltage signal, ideally at the power supply voltage, corresponds to the "1". In the current state-of-the-art, the power supply voltage can be around 3.3 volts for systems such as a computer motherboard, and around 1.8 volts for systems such as integrated circuit devices. In this description, these low voltage and high voltage signals are also referred to simply as "low signals" and "high signals."

In an integrated circuit device, a data bus can couple a plurality of devices, such as data banks or memory banks, to a plurality of input/output (I/O) buffers. These I/O buffers in turn are part of an electrical pathway that eventually leads outside the integrated circuit device to a device such as a computer motherboard. Therefore, when data needs to be transmitted from a data bank to any other part of the computer, the data travels out of the data bank (in the form of bits) through a bit line, across the data bus, and then out an I/O buffer. And when data needs to be transmitted into a data bank on the chip, the data comes in from an I/O buffer, travels across the data bus, and then goes into the data bank though a bit line. High and low signals that represent actual data moving between data banks and I/O buffers are referred to herein as high and low "data signals." All other electrical signals are referred to simply as "signals."

FIG. 1 illustrates a simplified data bus architecture on a integrated circuit device as described above. Here, a two-bit data bus 100 (i.e. composed of two wires) connects four data banks 102, 104, 106, and 108 to two I/O buffers 114. Data banks 102–108 represent any and all devices that can be used in conjunction with a data bus, including but not limited to memory banks (e.g. RAM or ROM) or processors. Each data bank in this architecture is coupled to two bit lines 110 for transmitting data. It should be noted that many more lines for carrying data are typically used, and FIG. 1 shows only two lines for clarity. In the current state-of-the-art, data buses can easily have 128 lines (a 128-bit data bus) or more, data banks can have 128 or more bit lines, and integrated circuit devices can have numerous I/O buffers 114. It should also be noted that the term "line" as used in this description refers to any form of wire or connection that can carry electrical signals.

As shown in FIG. 1, bit lines 110 are connected to data bus 100 through tri-state buffers 112, which provide the energy required to drive data signals from bit lines 110 to I/O buffers 114 across data bus 100. To drive a data signal means to move a data signal from one location to another. Enable signals (labeled as "EN" in FIG. 1) are used to control tri-state buffers 112 by enabling or disabling this driving function. Using tri-state buffers in data bus architectures for driving data signals from data banks to I/O buffers is well known and is a standard practice.

Tri-state buffers 112 drive high data signals from data banks 102–108 to I/O buffers 114 by providing current to charge data bus 100 up to a high voltage level. Due to electrical resistance and/or capacitance in data bus 100, a significant amount of time may be required for the driving tri-state buffer 112 to charge data bus 100 from around zero volts (which is the starting voltage level for data bus 100) up to a voltage level that can be sensed or detected as a high data signal by an I/O buffer 114. This time is increased if the specific I/O buffer 114 that is receiving the high data signal is physically located far away from the driving tri-state buffer 112. This situation can be understood by a comparison of the time required for data bank 102 versus the time required for data bank 108. Data bank 108 is physically located near I/O buffers 114, whereas data bank 102 is physically located far from I/O buffers 114. Consequently, the driving tri-state buffers 112 for data bank 108 require less time to charge data bus 100 up to a level sufficient for detection by I/O buffers 114 than the driving tri-state buffers 112 for data bank 102. The reason for the greater amount of time required by the driving tri-state buffers of data bank 102 is that these driving tri-state buffers 112 must charge a longer portion of data bus 100. All of this time acts to lower the response time of data bus 100, resulting in slower system performance.

The use of a tri-state scheme to drive data signals from data banks to I/O buffers therefore suffers from limitations. The loading is larger on a tri-state buffer, and a significant amount of time may be required for a tri-state buffer to charge a data bus. Accordingly, there is a need for a faster and more dynamic way to drive data signals from data banks to I/O buffers.

SUMMARY

The disadvantages and problems associated with driving data signals across a data bus using tri-state buffers have been improved upon using the present invention.

In accordance with an embodiment of the invention, a system for driving a data signal includes a data bus, a charging circuit coupled to the data bus that is configured to charge the data bus to a first voltage level, and a pull-down circuit coupled to the data bus that is configured to pull the data bus to a second voltage level. In a further embodiment, the system described above also includes a keeper circuit coupled to the data bus that is configured to maintain the data bus at the first voltage level after the charging circuit has charged the data bus.

In accordance with another embodiment of the invention, a method for driving a data signal across a data bus consists of charging the data bus to a first voltage level prior to driving the data signal across the data bus, maintaining the data bus at the first voltage level when a first type of data signal is to be driven across the data bus, and pulling the data bus to a second voltage level when a second type of data signal is to be driven across the data bus. In further embodiments, the first voltage level can correspond to a power supply voltage level, and the second voltage level can correspond to around zero volts.

An important technical advantage of the present invention includes using a data bus that is precharged high before transmitting data signals between a data bank and an I/O buffer. The use of a precharged data bus eliminates the time required to pull up the data bus when a high data signal is to be driven across it. And when a low data signal is to be driven, the data bus can be quickly brought down to a low voltage level using the pull-down circuit.

Other important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION

The embodiments of the present invention and their advantages are best understood by referring to FIGS. 2 through 6 of the drawings. Like numerals are used for like and corresponding parts of the various drawings.

Environment

A brief description of one operating environment for the invention is given here to aid in the understanding of the invention. It should be noted that this operating environment is being provided solely for ease in understanding the invention, and should not be interpreted as imposing limitations on the invention. The systems and methods of the invention can be used in environments other than the one provided here.

Figure 1:
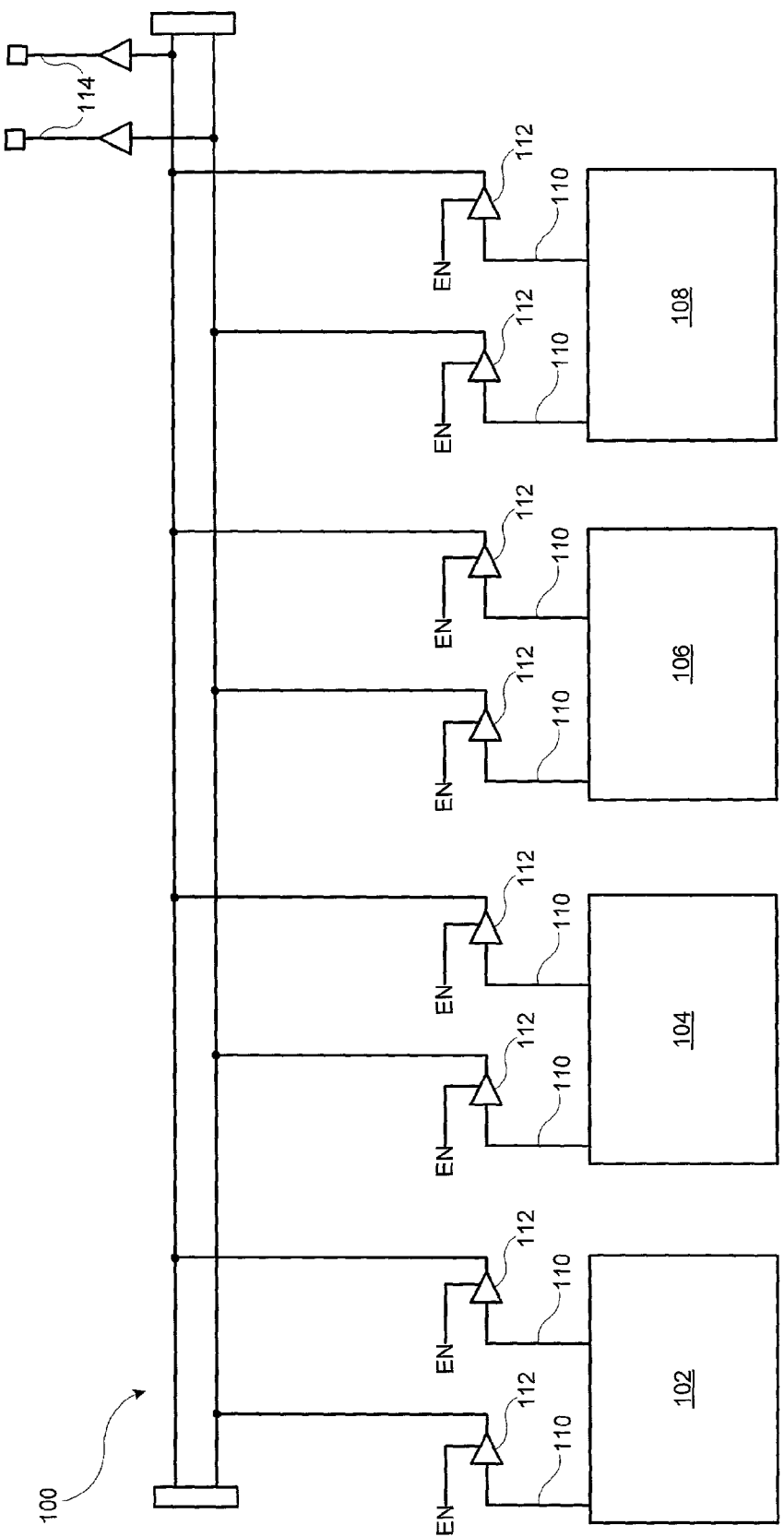
FIG. 1 is a schematic diagram of a prior art data bus architecture.
Figure 2:
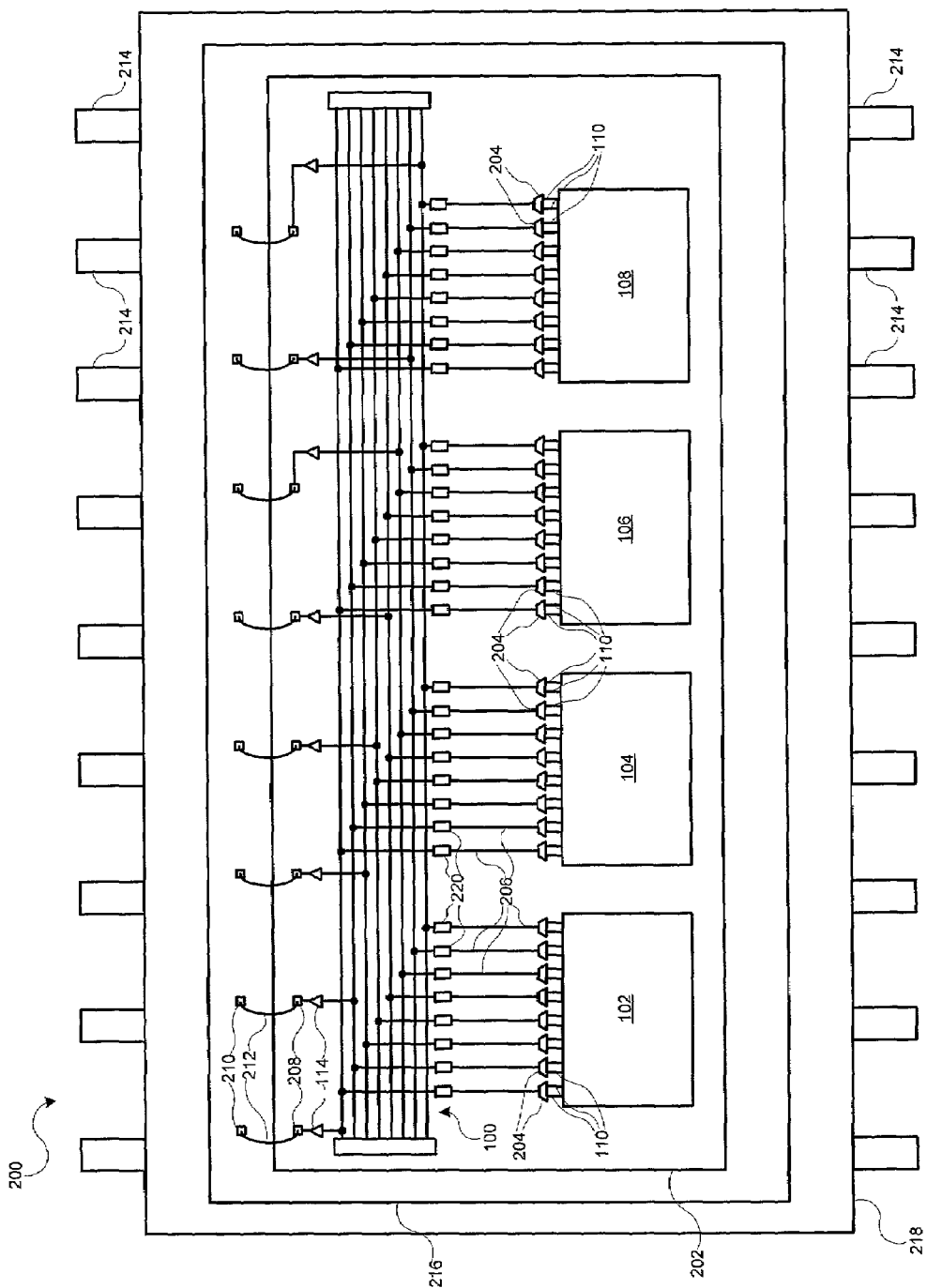
FIG. 2 is a schematic diagram of an integrated circuit device illustrating one operating environment for the systems and methods of the invention.

FIG. 2 illustrates an exemplary operating environment inside an integrated circuit device 200 into which an embodiment of the present invention may be incorporated. Integrated circuit device 200 is composed of a package 218 within which a substrate 216 and a silicon die 202 are housed. Various circuitry can be formed on silicon die 202. Here, this circuitry includes a data bus 100 which, in this example, is an 8-bit bus (composed of eight lines for transmitting data).

The circuitry on silicon die 202 also includes data banks 102–108. Data banks 102–108 are coupled to a plurality of bit lines 110 for sending data. In this example there are sixteen bit lines 110 coming off each data bank. Because the number of bit lines 110 (sixteen) exceeds the number of available data bus 100 lines (eight), multiplexers 204 can be used to multiplex the sixteen bit lines 110 down to eight bit lines 206 to match the number of available lines on data bus 100. In general, multiplexers 204 are devices that multiplex (combine) several signals for transmission over a single medium, in this case combining two bit lines 110 into one bit line 206. Each multiplexer 204 may also be capable of de-multiplexing or separating multiplexed signals from a transmission line so that processing of both outgoing and incoming signals is possible. This is one form of an I/O hierarchical scheme used to connect a plurality of bit lines 110 to data bus 100. Other forms of I/O hierarchical schemes can also be used in this environment.

Bit lines 206 are coupled to data bus 100 through respective pull-down circuits 220. Pull-down circuits 220 are illustrated and described in more detail below with reference to FIG. 3. They are referenced here primarily to illustrate their location relative to other elements in this exemplifying operating environment.

A plurality of I/O buffers 114, each coupled on one end to respective lines of data bus 100, are also located on silicon die 202. These I/O buffers 114 are used to move data signals off and onto data bus 100. The other ends of I/O buffers 114 are coupled to a first set of bond pads 208, which are in turn connected to a second set of bond pads 210 via bond wires 212. The second set of bond pads 210 are generally located on a set of pins 214. Pins 214 extend from the inside to the outside of integrated circuit device 200 and provide a physical connection for conveying data signals into and out of integrated circuit device 200. It is over this electrical pathway that data signals travel between I/O buffers 114 and the outside of integrated circuit device 200.

Please note that in the foregoing exemplifying operating environment, any number of data banks, bit lines, multiplexers, data bus lines, I/O buffers, or any other element mentioned could have been used. The specific numbers used for each element in FIG. 2 were provided for illustrative purposes only and are not to be construed as limiting.

Data-Read and Data-Write Cycles

When data is being transmitted into and out of a data bank 102–108, the timing of different events that occur is important to ensure that I/O buffers 114 or input bit lines sense data signals off data bus 100 at appropriate times. Therefore, the process of moving data signals may be carried out over predetermined cycles that synchronize when these events occur. These are called data-read and data-write cycles.

A data read cycle is a cycle during which a data signal is moved out of or "read" from a data bank 102–108 through a bit line 206, across data bus 100, and out the corresponding I/O buffer 114. During the first portion of the data read cycle, a data signal is moved from data bank 102–108 to data bus 100. Then, at a specific moment in time towards the end of the data read cycle, I/O buffer 114 senses the voltage level of data bus 100 to determine whether a high data signal or a low data signal is being transmitted. If I/O buffer 114 senses that the voltage level of the respective line of data bus 100 is high, then a high data signal (a "1") is accordingly transmitted across I/O buffer 114 to bond pads 208 and 210, and then out integrated circuit device 200 via pins 214. But if I/O buffer 114 senses that the voltage level of data bus 100 is low, then a low data signal (a "0") is transmitted out of integrated circuit device 200 over the same pathway. A data write cycle is similar, but moves in the opposite direction.

Figure 6:
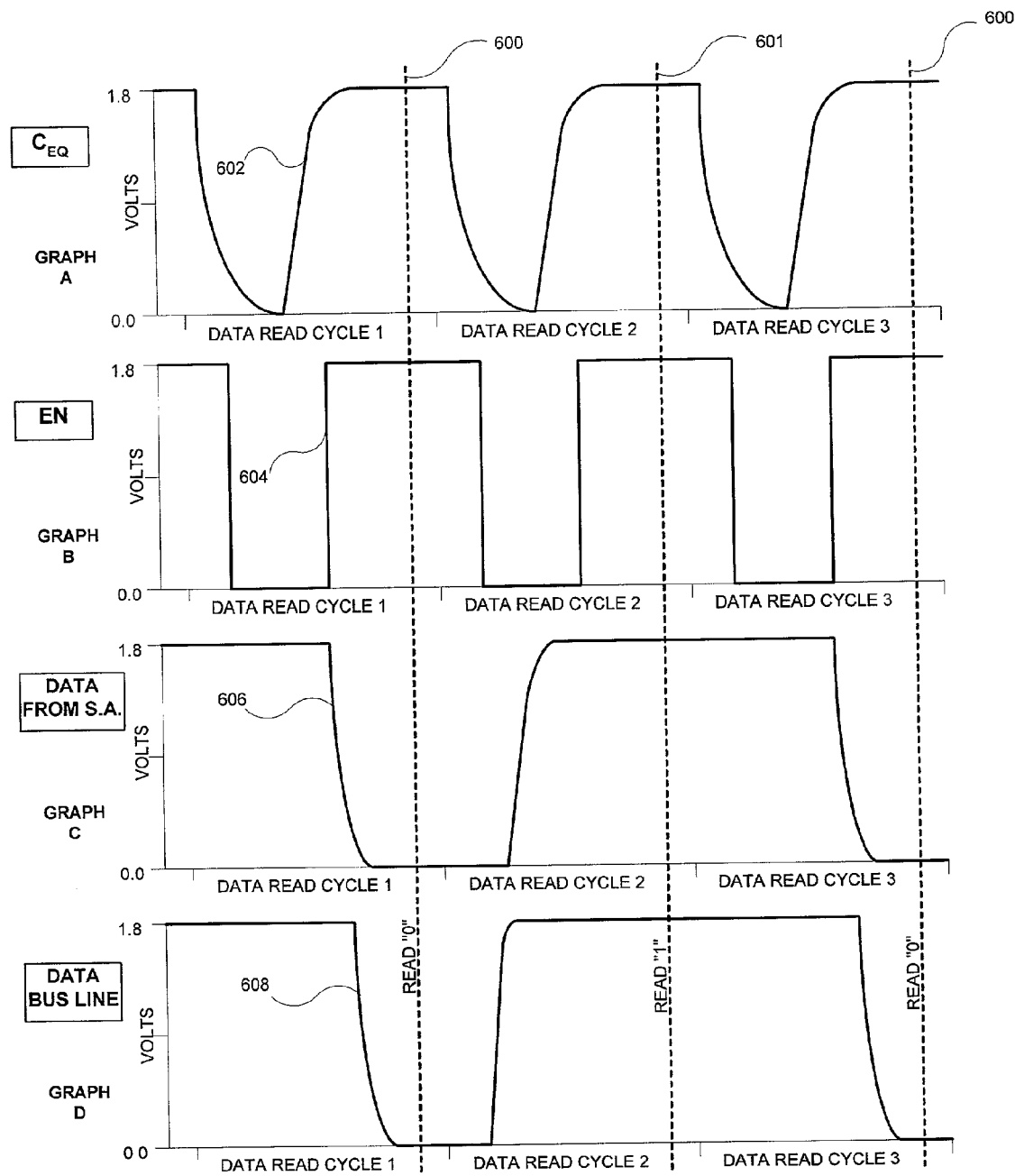
FIG. 6 consists of simulation diagrams plotting the voltage levels of several components of a system designed in accordance with the invention during three consecutive data-read cycles.

Timing diagrams and simulation diagrams illustrate how and when certain events occur during either a data-read or a data-write cycle. Simulation diagrams for an embodiment of the invention are illustrated in FIG. 6 and is discussed in more detail below.

Embodiments of the System of the Invention

Figure 3:
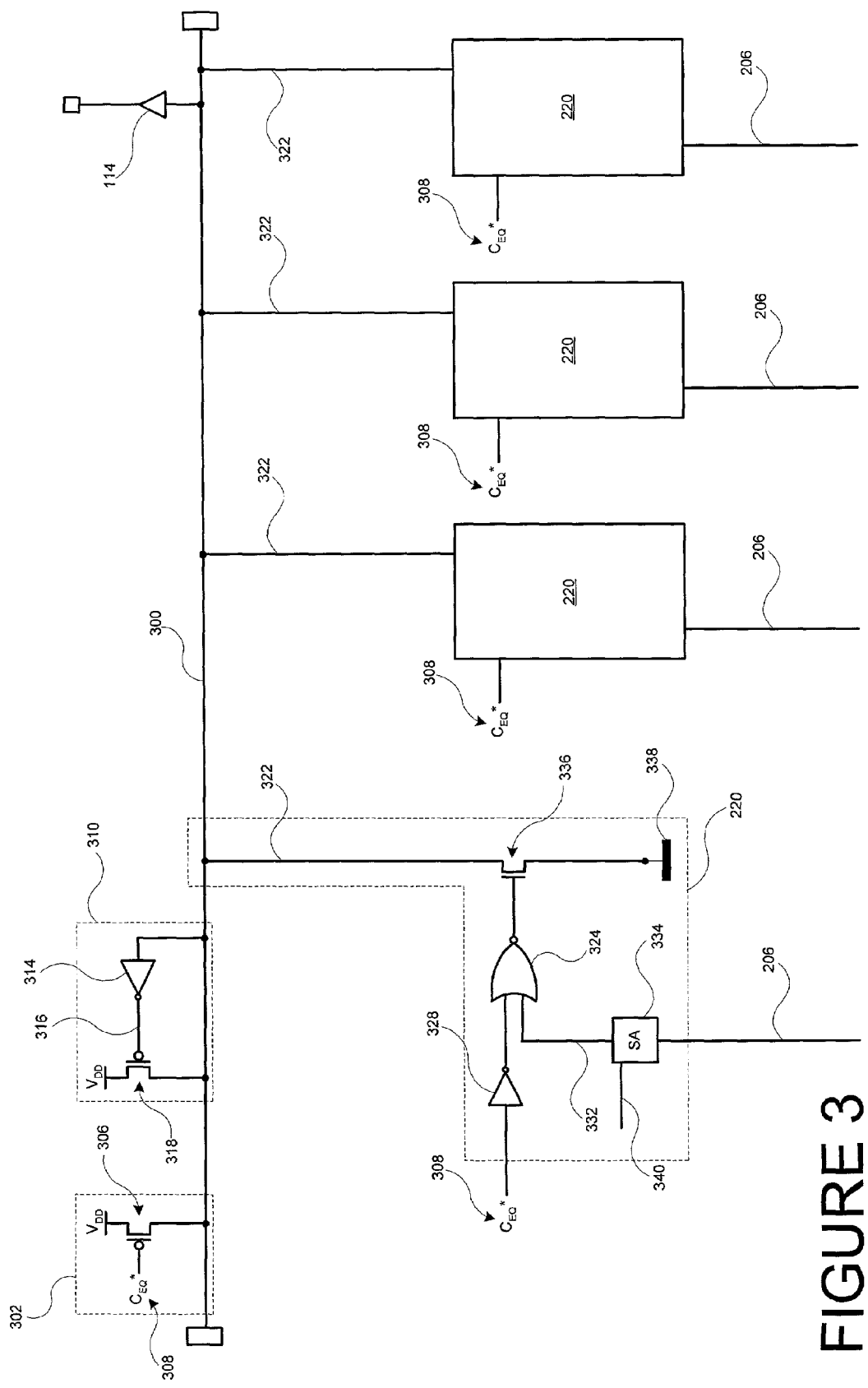
FIG. 3 is a schematic diagram of circuitry in which a dynamic data bus is provided, in accordance with an embodiment of the invention.

FIG. 3 is a schematic diagram of circuitry in which a dynamic data bus is provided, in accordance with an embodiment of the invention. For clarity, only a single data bus line 300 of data bus 100 is shown.

The dynamic data bus circuitry shown in FIG. 3 includes a charging circuit 302, a keeper circuit 310, and a pull-down circuit 220, all of which are coupled to data bus line 300. Charging circuit 302 is used to charge data bus line 300 up to a high voltage level, typically the power supply voltage level. Keeper circuit 310 functions to maintain or "keep" data bus line 300 at the power supply voltage level after it has been charged by charging circuit 302. And pull-down circuit 220 is used to bring data bus line 300 down to a low voltage level (around zero volts) whenever a low data signal (a "0") is to be driven across it. Generally, there may be a plurality of pull-down circuits 220, one for each bit line 206 that is coupled to data bus line 300 (as was shown in FIG. 2). FIG. 3 shows four pull-down circuits 220, corresponding to four bit lines 206 coming from any one or more of the four data banks 102–108. Only the first pull-down circuit 220 (coupled to, for example, data bank 102) is shown in detail, again for clarity. Accordingly, the other three boxes referenced as "220" can be considered to be constructed in similar fashion to the first.

Charging circuit 302 is used to charge data bus line 300 up to the power supply voltage level. In one embodiment, charging circuit 302 includes a p-type transistor 306 (a PMOS transistor) coupled at one end to data bus line 300, and coupled at the other end to a power supply voltage source (referred to herein as $V_{DD}$).

P-type transistor 306 receives a column equilibration ($C_{EQ}$) signal 308 at its gate. $C_{EQ}$ signal 308 is kept at a high voltage level during a large portion of each data-read and data-write cycle. When $C_{EQ}$ signal 308 is high, p-type transistor 306 is turned off and current does not flow from $V_{DD}$ to data bus line 300. Thus, charging circuit 302 has no effect on data bus line 300. But during a column transition, which typically occurs at the very beginning of a data-read or a data-write cycle, a $C_{EQ}$ pulse is sent that turns on p-type transistor 306. Since $C_{EQ}$ signal 308 is normally kept at a high voltage level, the $C_{EQ}$ pulse is a low signal pulse, generally around zero volts. During this $C_{EQ}$ pulse p-type transistor 306 is turned on, thereby activating charging circuit 302. This allows current to flow from $V_{DD}$ to data bus line 300 so that data bus line 300 is pulled up to the power supply voltage level.

As explained above, this charging function occurs at the beginning of a data-read or data-write cycle when the $C_{EQ}$ pulse is sent. Thus, data bus line 300 is precharged to a high voltage level before a data signal is transmitted across it.

In embodiments of the invention, each data bus line 300 has its own charging circuit 302. In other embodiments, one charging circuit 302 may be coupled to two or more data bus lines 300 to provide the charging function to more than one data bus line 300.

Keeper circuit 310 is used to maintain data bus line 300 at the power supply voltage level. In an embodiment, keeper circuit 310 includes an inverter 314 having an input terminal that is coupled to data bus line 300. An output terminal of inverter 314 is coupled via a line 316 to the gate of a p-type transistor 318. The p-type transistor 318 is coupled to data bus line 300 at one end and to $V_{DD}$ at the other end.

In situations where data bus line 300 is at a high voltage level, keeper circuit 310 is active and couples data bus line 300 to $V_{DD}$. This maintains data bus line 300 at the power supply voltage level. In particular, when data bus line 300 is at a high level, inverter 314 outputs a low voltage signal which turns on p-type transistor 318, thus allowing current to flow from $V_{DD}$ to data bus line 300.

In situations where data bus line 300 is pulled low (e.g. to drive a low data signal across data bus line 300), keeper circuit 310 is deactivated so current no longer flows to data bus line 300 from $V_{DD}$. In particular, as data bus 300 is pulled low, inverter 314 outputs a high voltage signal, thus turning off p-type transistor 318. This prevents current from flowing between $V_{DD}$ and data bus line 300.

Pull-down circuits 220 are used during a data-read cycle to bring data bus line 300 down to a low voltage level whenever a low data signal (a "0") is to be driven from any of data banks 102–108 to an I/O buffer 114. A different set of pull-down circuits are used to bring data bus line 300 down to a low voltage level during data-write cycles, and these are discussed in more detail below with reference to FIG. 4.

In one embodiment, each pull-down circuit 220 includes an n-type transistor 336 (an NMOS transistor) that is connected to data bus line 300 on one end and to a ground 338 on the other. The term "ground" as used herein refers to an intentional or accidental conducting path between an electrical system or circuit and the earth or some conducting body acting in place of the earth. When n-type transistor 336 is turned on, current quickly flows through it from data bus line 300 to ground 338, thereby pulling the voltage level of data bus line 300 down to around zero volts. When n-type transistor 336 is turned off, pull-down circuit 220 has no effect on data bus line 300. In this instance, since data bus line 300 is precharged to a high voltage level, it remains at that high voltage level.

Pull-down circuit 220 further includes logic that controls n-type transistor 336. This logic contains a NOR gate 324 having an output terminal that is coupled to the gate of n-type transistor 336, thereby allowing output signals from NOR gate 324 to control n-type transistor 336. NOR gate 324 has two input terminals.

At a first input terminal, NOR gate 324 receives $C_{EQ}$ signal 308 after that signal has passed through an inverter 328. Since $C_{EQ}$ signal 308 is normally high (as discussed above), the signal at the first input terminal of NOR gate 324 is normally low (because of inverter 328). But when the $C_{EQ}$ pulse is sent, the signal at this first input terminal to NOR gate 324 is high.

At a second input terminal, NOR gate 324 receives data signals being sent from data bank 102. A sense amplifier 334 senses the actual data signals sent from data bank 102 via bit lines 206. A sense amplifier enable signal, applied via a line 340, controls when sense amplifier 334 passes data signals on to the second input terminal of NOR gate 324. The signal at the second input terminal is maintained at a high voltage level when no data signals are being transmitted out of data bank 102 (i.e. it may be precharged high). When sense amplifier 334 is transmitting high data signals, the signal at the second input terminal simply remains at its high voltage level. And when sense amplifier 334 is transmitting low data signals, the signal at the second input terminal is brought down to a low voltage level.

Thus, in this embodiment shown in FIG. 3, NOR gate 324 only outputs a high signal when the $C_{EQ}$ signal is high and the data signal out of data bank 102 is low.

In other embodiments, a differential data signal can be detected by sense amplifier 334, and the appropriate high or low data signal can then be sent to the input terminal of NOR gate 324. If a differential data signal scheme is used, sense amplifier 334 has another input terminal (not shown) to receive a signal that is compared to the data signal from bit line 206 to determine a differential.

Figure 4:
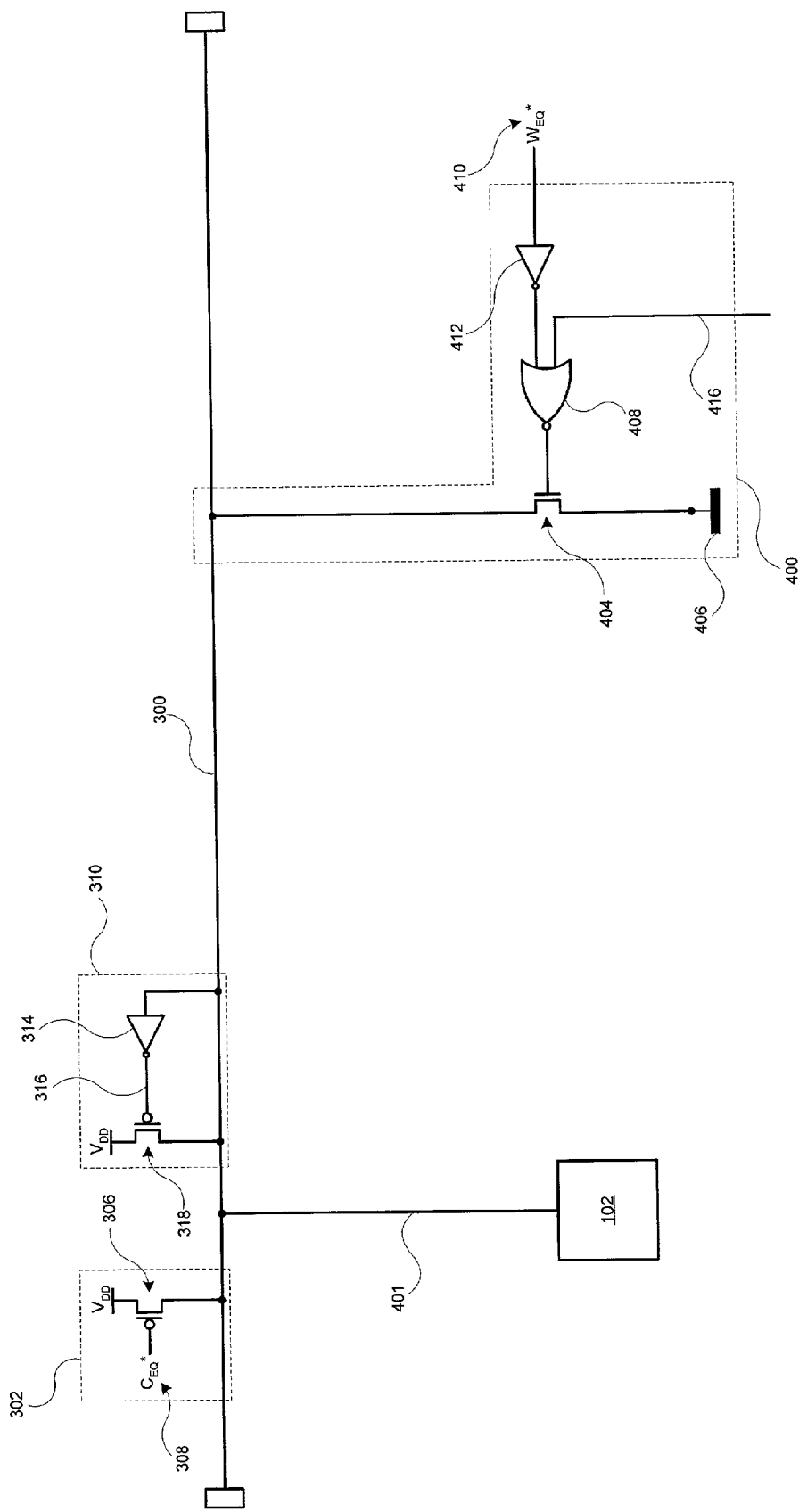
FIG. 4 is a schematic diagram of circuitry in which a dynamic data bus is provided, in accordance with another embodiment of the invention.

FIG. 4 is a schematic diagram of circuitry in which a dynamic data bus is used for data-write cycles, in accordance with another embodiment of the invention. Here, charging circuit 302 and keeper circuit 310 are constructed and utilized as described above. Pull-down circuits 220 for each data bank 102–108 can also be included in the circuitry of FIG. 4, but are not shown here for clarity. Furthermore, although only one data bank 102 is shown, any number of data banks can be included.

An input bit line 401 couples data bank 102 to data bus line 300. Input bit line 401 carries data signals off data bus line 300 and into data bank 102 during data-write cycles. At the appropriate moment during a data-write cycle, input bit line 401 transfers the voltage level of data bus line 300 as a low or a high data signal into data bank 102. Although only one input bit line 401 is shown, there is no limit to the number of input bit lines that data bank 102 can have.

The dynamic data bus circuitry for data-write cycles also comprises a data-write pull-down circuit 400. The design of data-write pull-down circuit 400 is almost identical to that of pull-down circuit 220 used for data-read cycles. In one embodiment, each data-write pull-down circuit 400 includes an n-type transistor 404 that is connected to data bus line 300 on one end and to a ground 406 on the other. When n-type transistor 404 is turned off no current is allowed to flow from data bus line 300 to ground, so that line 300 remains at a high voltage level. But when n-type transistor 404 is turned on, data bus line 300 is pulled low to around zero volts.

As with pull-down circuit 220, data-write pull down circuit 400 also includes logic that controls n-type transistor 404. This logic includes a NOR gate 408 having an output terminal that is coupled to the gate of n-type transistor 404, thus allowing output signals from NOR gate 408 to control n-type transistor 404. NOR gate 408 also has two input terminals. At a first input terminal, NOR gate 408 receives a write equilibration ($W_{EQ}$) signal 410 after that signal has passed through an inverter 412. $W_{EQ}$ signal 410 is similar to $C_{EQ}$ signal 308, but is used for data-write cycles.

At a second input terminal NOR gate 408 receives signals off line 416 that correspond to data signals being sent into data bank 102. As with pull-down circuit 220, the signal at the second input terminal is maintained at a high voltage level before data signals are transmitted across it. So when a high data signal is being transmitted into data bank 102, the signal at the second input terminal simply remains at its high voltage level. And when a low data signal is being transmitted into data bank 102, the signal at the second input terminal is brought down to a low voltage level.

Thus, in this embodiment shown in FIG. 4, NOR gate 408 only outputs a high signal when the $W_{EQ}$ signal is high and the data signal to be transferred into data bank 102 is low.

Embodiments of the Methods of the Invention

Figure 5:
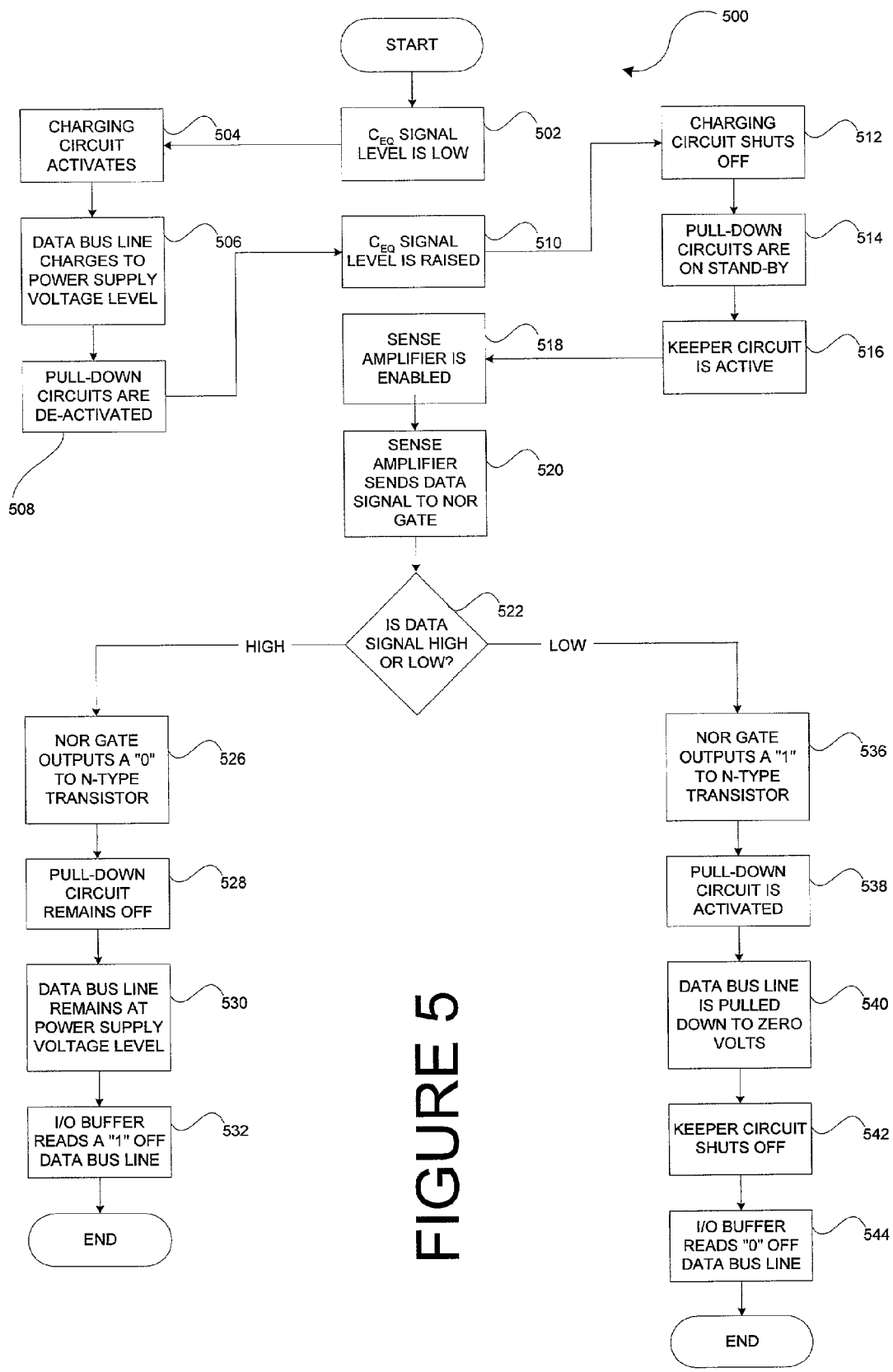
FIG. 5 is a flowchart of a method according to an embodiment of the invention.

FIG. 5 is a flowchart of a method 500 of transmitting data signals across a dynamic data bus during a data-read cycle, in accordance with an embodiment of the invention. In one embodiment, method 500 may be performed by the circuitry depicted in FIG. 3. Although FIG. 5 illustrates a number of particular steps performed in a particular order, it should be understood that not all of these steps or the order are necessary, or even desirable, in other embodiments of the invention.

Starting with step 502, method 500 begins with the voltage level of $C_{EQ}$ signal 308 at around zero volts. The drop in the voltage level of $C_{EQ}$ signal 308 activates charging circuit 302 at step 504. In particular, the low voltage level of $C_{EQ}$ signal 308 turns on p-type transistor 306, thereby allowing current to flow from $V_{DD}$ to data bus line 300. This action charges data bus line 300 up to the power supply voltage level at step 506.

At step 508, concurrently with charging circuit 302 supplying current to data bus line 300, pull-down circuit 220 is deactivated. This happens because the low $C_{EQ}$ signal 308 causes a high signal to be sent into NOR gate 324 (after passing through inverter 328). When NOR gate 324 receives a high signal at either of its two input terminals it outputs a low signal to n-type transistor 336. This low signal turns off n-type transistor 336, thereby preventing pull-down circuit 220 from being activated.

At step 510, $C_{EQ}$ signal 308 is raised back up to a high level, thereby ending the $C_{EQ}$ pulse. Accordingly, at step 512, charging circuit 302 is shut off. In particular, the high level $C_{EQ}$ signal turns off p-type transistor 306, thereby preventing the flow of current from $V_{DD}$ to data bus line 300 via charging circuit 302.

Next, at step 514, pull-down circuits 220 are put into a "stand-by" mode. Here, since $C_{EQ}$ signal 308 is now causing a low signal to be sent into NOR gate 324 (because of inverter 328), the output of NOR gate 324 depends on signals coming from sense amplifier 334. So in essence, pull-down circuit 220 is standing by until sense amplifier 334 activates it.

At step 516, sometime during the $C_{EQ}$ pulse, keeper circuit 310 is activated. Keeper circuit 310 automatically turns on when the voltage level of data bus line 300 can be sensed as a high signal.

At step 518, sense amplifier 334 is enabled with the sense amplifier enable signal. This can occur sometime during the $C_{EQ}$ pulse. When enabled, sense amplifier 334 transmits a data signal received from bit lines 206 to NOR gate 324, as shown in step 520. The data signal is sent over a line 332, which is maintained at a high voltage level when no data signals are being driven across it. Therefore, if the data signal being driven is a high data signal, line 332 remains at a high voltage level. But if the data signal being driven is a low data signal, line 332 is pulled low.

One reason for maintaining line 332 at a high voltage level when no data is being transmitted is that this sends a high signal into NOR gate 324. As a result, the output of NOR gate 324 is a low signal, turning off n-type transistor 336. Thus, pull-down circuit 220 has no effect on data bus line 300.

At step 522, depending on whether the data signal being sent is a high signal or a low signal, one of two different sequences of events can occur. If the data signal is a high signal, nothing happens. Pull-down circuit 220 remains off and data bus line 300 remains at a high voltage level. Accordingly, a high data signal is "driven" onto data bus line 300. But if the data signal is a low signal, pull-down circuit 220 activates and data bus line 300 is pulled down to around zero volts.

In particular, if the data signal coming out of sense amplifier 334 is a high signal, NOR gate 324 will have a low signal (from inverter 328) and a high signal at its input terminals. If either input terminal of NOR gate 324 receives a high signal, NOR gate 324 outputs a low signal. Therefore, at step 526, NOR gate 324 outputs a low signal to n-type transistor 336. Accordingly, pull-down circuit 220 remains off at step 528. Next, at step 530, because pull-down circuit 220 is not activated, data bus line 300 remains at its high voltage level. Finally, at step 532, I/O buffer 114 senses the data signal on data bus line 300. Because the voltage level of data bus line 300 is near the power supply voltage level a high data signal (a "1") is transmitted into I/O buffer 114.

Alternatively, if the data signal coming out of sense amplifier 334 is a low signal, NOR gate 324 has a low signal at each of its input terminals. In this situation NOR gate 324 outputs a high signal, at step 536, to n-type transistor 336. When n-type transistor 336 receives the high signal, it is turned on and pull-down circuit 220 is activated, at step 538. Next, at step 540, data bus line 300 is pulled down to around zero volts as current flows from line 300 to ground 338. At step 542, as data bus line 300 is pulled down, keeper circuit 310 shuts off. Finally, at step 544, I/O buffer 114 senses the data signal on data bus line 300. Because the voltage level of data bus line 300 is near zero volts, a low data signal (a "0") is transmitted into I/O buffer 114.

Data-write cycles proceed much like the data-read cycles described above because data-write pull-down circuits 400 can be configured similarly to pull-down circuits 220. The main difference for data-write cycles is that the direction that the data signals travel is opposite of that for data-read cycles. Data signals being sent into data bank 102 generally arrive on a set of I/O buffers (not shown) that are different from I/O buffers 114. These data signals are applied at one input terminal of NOR gate 408 in data-write pull-down circuit 400. One of two events occurs depending on whether the data signal is high or low.

In an operation similar to that described above for data-read cycles, if the data signal is high in a data-write cycle, data-write pull-down circuit 400 is not activated. In particular, a high data signal causes NOR gate 408 to output a low signal which turns off n-type transistor 404. Accordingly, data bus line 300 stays at a high voltage level, causing input bit line 401 to deliver a high data signal into data bank 102. Alternatively, a low data signal activates data-write pull-down circuit 400 which then pulls data bus line 300 low. Accordingly, input bit line 401 delivers a low data signal into data bank 102.

Simulation Diagrams

FIG. 6 is a set of simulation diagrams that illustrate the timing of various events that occur as an embodiment of the invention is carried out. Four graphs—labeled Graph A, Graph B, Graph C, and Graph D—plot exemplifying voltage levels of different signals in the circuitry for a dynamic data bus over the course of three data-read cycles. In this example, the three data-read cycles drive data signals corresponding to a "0", a "1", and a "0" from data bank 102 to I/O buffer 114. In addition, dashed lines 600 and 601 represent moments in each data read cycle when I/O buffer 114 senses the data signal on data bus line 300.

Graph A of FIG. 6 contains a plot line 602 that traces the voltage level of $C_{EQ}$ signal 308 over three data-read cycles. It can be seen that shortly after each data-read cycle begins, the voltage level of $C_{EQ}$ signal 308 drops from a high voltage level to around zero volts. A short time later it returns to a high voltage level, and remains there until the beginning of the next data-read cycle. Each dip in $C_{EQ}$ signal 308 represents a $C_{EQ}$ pulse. This dip is generally present for each data-read cycle and each data-write cycle. It should be understood that in alternative embodiments, the voltage level of $C_{EQ}$ signal 308 may begin and end at a low voltage level in each data-read cycle, with a rise up to a high voltage being a $C_{EQ}$ pulse.

Graph B contains a plot line 604 that traces the voltage level of the sense enable signal over three data-read cycles. As described above, the sense enable signal arrives at sense amplifier 334 on line 340. Graph B shows that the sense enable signal drops to zero volts shortly after each data-read cycle begins and remains at zero volts during a large portion of each $C_{EQ}$ pulse. After the $C_{EQ}$ pulse is complete, the sense enable signal goes to a high voltage level, causing sense amplifier 334 to deliver a data signal to line 332 (again, the data signals in this example are "0," "1," "0"). The sense amplifier enable signal then remains high until shortly after the next data-read cycle begins. Again, it should be understood that in alternative embodiments, the $C_{EQ}$ pulse can comprise an increase in voltage level rather than a decrease.

Graph C contains a plot line 606 that traces the voltage level for the output signal of sense amplifier 334 over three data-read cycles. This output signal carries data signals from data bank 102. As shown in this graph, the voltage level of line 332 begins at a high level because the line is precharged high. In the first and third data-read cycle (in which the data valves are both "0"), the voltage level of the output signal of sense amplifier 334 quickly drops to around zero volts at the same time that the sense amplifier enable signal goes to a high level. This demonstrates how the sense amplifier enable signal causes sense amplifier 334 to drive the low data signals ("0") onto line 332. And in the second data-read cycle, when a high data signal ("1") is being driven, the voltage level of the output signal of sense amplifier 334 remains at a high voltage level when the sense amplifier enable signal goes high. Here, since line 332 is precharged to high during a column transition, it is already at a high voltage level when sense amplifier 334 is enabled to drive the high data signal.

It should be noted that each time the voltage level of the sense amplifier output signal 332 is around zero volts, pull-down circuit 220 is activated. As explained above, this occurs because NOR gate 324 receives two low signals at its input terminals, and therefore outputs a high signal that turns on n-type transistor 336. This activates pull-down circuit 220, and its effect is shown in graph D.

Graph D contains a plot line 608 that traces the voltage level of data bus line 300 over three data-read cycles. This voltage level starts out high because charging circuit 302 is activated during each $C_{EQ}$ pulse. In the first and third data-read cycles, right after the voltage level of the sense amplifier 334 output signal drops to around zero volts and pull-down circuit 220 is activated, the voltage level of data bus line 300 also quickly drops down to around zero volts. Next, at moment 600 when I/O buffer 114 senses the voltage level of data bus line 300, I/O buffer 114 drives a low data signal (a "0") out of the integrated circuit device. The voltage level of data bus line 300 remains low until the next $C_{EQ}$ pulse, at which time this voltage level is again brought to a high level by charging circuit 302. And in the second data-read cycle, when a high data signal ("1") is being driven, the voltage level of data bus line 300 remains high because pull-down circuit 220 is not activated. Then, at moment 601 when I/O buffer 114 senses the voltage level of data bus line 300, I/O buffer 114 drives a high data signal (a "1") out of the integrated circuit device.

Accordingly, systems and methods of the present invention have been described for providing a high-speed dynamic bus. Unlike previously developed techniques in which tri-state buffers are used to drive a bus, the systems and methods of the present invention maintain bus lines at one voltage level (e.g., either voltage supply level or ground) from which data signals can be rapidly sensed (either by reading the maintained voltage level of a bus line, or by pulling up/down the voltage level of the bus line and reading that voltage level). For the case in which the maintained voltage level is sensed at the level of the data signal, no electrical resistance/capacitance needs to be overcome. For the case in which the voltage level of the bus line is pulled up/down before sensing, provision of a pull-up circuit and/or pull down circuit on the data bus line allows the voltage level of the bus line to be quickly changed.

While various embodiments of the invention have been shown and described, it will be apparent to those skilled in the art that numerous alterations may be made without departing from the inventive concepts presented herein. Thus, the invention is not to be limited except in accordance with the following claims and their equivalents.

What is claimed is:

1. A system for driving a data signal, comprising:
   a plurality of bit lines;
   a data bus having a plurality of bus lines, wherein each bus line is connectable to a respective portion of the plurality of bit lines;
   a charging circuit coupled to at least one of the bus lines of the data bus, wherein the charging circuit is configured to pre-charge the at least one of the bus lines of the data bus to a first voltage level in advance of driving a first type of data signal or a second type of data signal across the at least one of the bus lines; and
   a pull-down circuit coupled to the at least one of the bus lines of the data bus, wherein the pull-down circuit is configured to pull the at least one of the bus lines of the data bus to a second voltage level, wherein the pull-down circuit comprises:
   a transistor coupled at one end to the at least one of the bus lines of the data bus and at the other end to ground; and
   logic circuitry coupled to a gate of the transistor, wherein an output signal from the logic circuitry controls the transistor, wherein the logic circuitry comprises a first input terminal for receiving an equilibration signal and a second input terminal for receiving a data signal.

2. The system of claim 1, further comprising a keeper circuit coupled to the at least one of the bus lines of the data bus, wherein the keeper circuit is configured to maintain the at least one of the bus lines of the data bus at the first voltage level after the at least one of the bus lines of the data bus has been charged.

3. The system of claim 2, wherein the keeper circuit comprises:
   a transistor coupled at one end to a power supply voltage source and at the other end to the at least one of the bus lines of the data bus; and
   logic circuitry coupled to a gate of the transistor, wherein an output signal from the logic circuitry controls the transistor.

4. The system of claim 3, wherein the logic circuitry comprises an inverter gate.

5. The system of claim 1, wherein the logic circuitry comprises a NOR gate.

6. The system of claim 1, wherein the charging circuit comprises:
   a transistor coupled at one end to a power supply voltage source and at the other end to the at least one of the bus lines of the data bus, wherein the transistor is controlled by an equilibration signal.

* * * * *